United States Patent
Toriumi et al.

(10) Patent No.: US 6,803,170 B2
(45) Date of Patent: Oct. 12, 2004

(54) RESIST COMPOSITION AND METHOD FOR MANUFACTURING SEMICONDUCTOR DEVICE USING THE RESIST COMPOSITION

(75) Inventors: Minoru Toriumi, Kanagawa (JP); Isao Satou, Kanagawa (JP); Hiroyuki Watanabe, Kanagawa (JP); Shunji Katai, Tokyo (JP); Shintaro Suzuki, Tokyo (JP)

(73) Assignees: Semiconductor Leading Edge Technologies, Inc., Kanagawa (JP); Idemitsu Petrochemical Co., Ltd., Tokyo (JP)

( * ) Notice: Subject to any disclaimer, the term of this patent is extended or adjusted under 35 U.S.C. 154(b) by 113 days.

(21) Appl. No.: 09/925,679

(22) Filed: Aug. 10, 2001

(65) Prior Publication Data

US 2002/0022193 A1 Feb. 21, 2002

(30) Foreign Application Priority Data

Aug. 11, 2000 (JP) ........................................ 2000-244161

(51) Int. Cl.⁷ .............................................. G03F 7/004
(52) U.S. Cl. ..................... 430/270.1; 430/905; 430/910
(58) Field of Search ............................. 430/270.1, 905, 430/910

(56) References Cited

U.S. PATENT DOCUMENTS

| 5,968,713 A | 10/1999 | Nozaki et al. | 430/326 |
| 6,124,074 A | 9/2000 | Varanasi et al. | 430/270.1 |
| 6,313,327 B1 * | 11/2001 | Seo et al. | 552/553 |

FOREIGN PATENT DOCUMENTS

| EP | 0 540 032 A1 | 5/1993 |
| EP | 1 067 112 A2 | 1/2001 |
| EP | 1 126 320 A2 | 8/2001 |
| JP | 5-127370 | 5/1993 |
| JP | 9-265177 | 10/1997 |

OTHER PUBLICATIONS

Kaimoto, Y., "Alicyclic Polymer for ArF and KrF Excimer Resist Based on Chemical Amplification," *SPIE*, vol. 1672 *Advances in Resist Technology and Processing IX*, pp. 66–73, 1992.

* cited by examiner

Primary Examiner—John S. Chu
(74) Attorney, Agent, or Firm—Foley & Lardner LLP

(57) ABSTRACT

A resist composition comprises: at least one type of a first compound having two or more intramolecular adamantyl structures represented by the chemical formula 1 below; a base resin; and a second compound which generates an acid by active beam irradiation.

[Chemical formula 1]

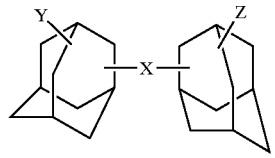

wherein X is $-(OCO)_m-(CH_2)_n-(COO)_m-$, where $m=0$ or 1 and $n=0, 1, 2$ or 3 provided when $n=0$, $m=0$; and Y and Z are H, OH, F, Cl, Br, R or COOR, where Y may be Z, or Y and Z may be introduced in a single adamantyl structure and R represents a straight or branched alkyl group having 1 to 8 carbon atoms.

21 Claims, 1 Drawing Sheet

Composition ratio of 3,3'-dibromo-1,1'-biadamantane
[wt parts, to 100 wt parts of base resin]

RESIST COMPOSITION AND METHOD FOR MANUFACTURING SEMICONDUCTOR DEVICE USING THE RESIST COMPOSITION

BACKGROUND OF THE INVENTION

1. Field of the Invention

The present invention relates to a resist composition and a method for manufacturing a semiconductor device using the resist composition. In particular, the present invention relates to a resist composition suitable for fine processing of a semiconductor device using ArF excimer laser as a light source.

2. Description of the Background Art

A semiconductor integrated circuit has been highly integrated and a minimum pattern width in the integrated circuit has become to a level of sub-half microns. Further, such device has been being finer. A lithography technique on which such finer processing is based generally comprises the steps of: applying a resist on the surface of a substrate to be processed to form a photosensitive film; irradiating the resist with a light to delineate a given pattern; heating, if necessary, the resist; developing the resist to form a desired fine pattern; and processing the substrate to be processed by, e.g., etching using the fine pattern as a protection film.

A lithography technique by which a fine pattern of 0.18 μm or less is formed has been recently required. As an approach for the finer pattern, a reduction in a wavelength of exposure light used during patterning of a resist has been investigated.

Conventionally, the i-line in a high-pressure mercury-vapor lamp (wavelength: 365 nm) has been used as a light source for manufacturing a DRAM with an integration degree up to 64 M bits.

KrF excimer laser (wavelength: 248 nm) has been practically used as an exposure light source in place of the i-line for mass production of a 256 M bit DRAM.

Now, a further shorter light source has been investigated, aiming at manufacturing a DRAM with an integration degree of 1 G bit or more, and the use of ArF excimer laser (wavelength: 193 nm), $F_2$ excimer laser (wavelength: 157 nm), X-ray and electron beam is believed to be effective. Among these light sources, ArF excimer laser lithography with a higher resolution may be promising.

In conventional lithography using the i-line, an alkali-soluble phenol resin such as a novolac resin has been used as a base resin for a resist composition in order to provide higher dry etching resistance.

The alkali-soluble phenol resin shows good transmittance for the i-line while exhibiting poor transmittance for far ultraviolet or vacuum ultraviolet ray with a shorter wavelength. In particular, for an exposure light from ArF excimer laser as a light source, transmittance is extremely reduced due to optical absorption by an aromatic ring in the resin.

Thus, an exposure light with a shorter wavelength cannot adequately sensitize a resist film to the bottom and therefore, does not form a resist pattern with a good cross section. In other words, it does not provide an adequate resolution.

So, a methacrylate copolymer resin without an aromatic ring has been investigated as a resin exhibiting good transmittance to an exposure light with a shorter wavelength.

However, dry etching resistance may be significantly reduced without an aromatic ring in a resin. To solve the problem, there has been disclosed a polymer having an alicyclic hydrocarbon group such as adamantyl and norbornyl group in an ester moiety.

It is, however, difficult to form an even applied film with good reproductivity because a homopolymer of the monomer with the alicyclic hydrocarbon group is highly hydrophobic and exhibits poor adhesiveness to a substrate to be processed (for example, a silicon substrate). It may, therefore, lead to poor development properties or lower resolution.

Thus, a copolymer comprising a copolymer component improving development properties or a copolymer component improving adhesiveness has been added to the resin to be used as a base resin of a resist component.

However, since the content of the copolymer must be about 50 mol % or more, it may significantly deteriorate dry etching resistance, leading to poor practicability.

As described above, an adequate alicyclic hydrocarbon group has not been contained in components in a conventional resist composition using an alicyclic methacrylate exhibiting good transmittance to a short-wavelength light such as ArF excimer laser as a base resin.

Thus, it may lead to lower resistance to dry etching conducted after forming a resist pattern, to reduction in a film thickness of a resist pattern and to poor mask linearity.

There has been, therefore, a defect in a conventional resist composition that a resist pattern fails to be correctly transferred to a substrate to be processed.

SUMMARY OF THE INVENTION

The present invention has been conceived to solve the previously-mentioned problems and a general object of the present invention is to provide a resist composition exhibiting good resolution to a far ultraviolet ray with a wavelength of 250 nm or less, in particular ArF excimer laser beam, and is to provide a resist composition exhibiting good dry etching resistance.

The above object of the present invention is attained by a following resist component and a following method for manufacturing a semiconductor device.

According to one aspect of the present invention, the resist composition comprises: at least one type of a first compound having two or more intramolecular adamantyl structures; a base resin; and a second compound which generates an acid by active beam irradiation.

In one aspect of the present invention, the resist composition further comprises preferably a nonion surfactant.

In one aspect of the present invention, the resist composition further comprises preferably an amine.

According to another aspect of the present invention, the method for manufacturing a semiconductor device comprises: an application step of forming a resist film by means of applying the resist composition according to the one aspect of the present invention onto a substrate; a pre-exposure heating step of heating the resist film formed in the application step; an exposure step of exposing the resist film by means of irradiating the resist film with an active beam via a given mask after the pre-exposure heating step, the active beam having a wavelength of 150 to 250 nm; a post-exposure heating step of heating the resist film after the exposure step; a development step of forming a resist pattern by means of developing the resist; and an etching step of conducting dry etching with the resist pattern as a mask.

Other objects and further features of the present invention will be apparent from the following detailed description when read in conjunction with the accompanying drawings.

DETAILED DESCRIPTION OF THE PREFERRED EMBODIMENTS

Figure 1:
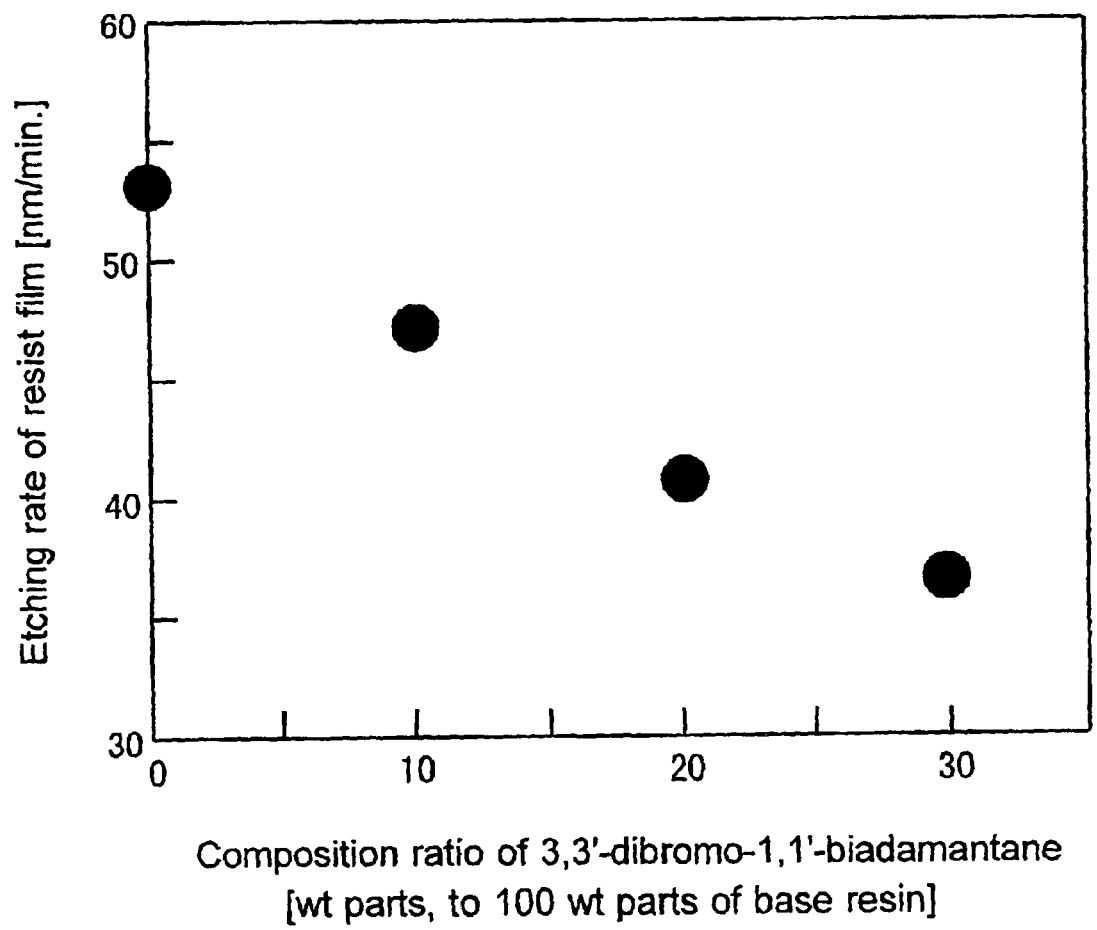
FIG. 1 is a drawing for describing a relation between composition ratio of first compound in resist composition and etching rate of resist film, according to the present invention.

In the following, principles and embodiments of the present invention will be described with reference to the accompanying drawings. The members and steps that are common to some of the drawings are given the same reference numerals and redundant descriptions therefore may be omitted.

First Embodiment

A resist composition according to a first embodiment of the present invention comprises: at least one type of a first compound having two or more intramolecular adamantyl structures; a base resin; and a second compound which generates an acid by active beam irradiation.

The first compound contained in the resist composition will be first described in detail.

The first compound is a low molecular-weight compound represented by the following chemical formula 1:

[Chemical formula 1]

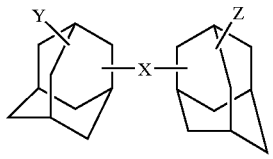

wherein X is $-(OCO)_m-(CH_2)_n-(COO)_m-$, where m=0 or 1 and n=0, 1, 2 or 3 provided when n=0, m=0; and Y and Z are H, OH, F, Cl, Br, R or COOR, where Y may be Z, or Y and Z may be introduced in a single adamantyl structure and R represents a straight or branched alkyl group having 1 to 8 carbon atoms.

Specific examples of the first compound include 3,3'-dibromo-1,1'-biadamantane, di(1-adamantyl)succinic acid, di(1-adamantyl)malonic acid, 3,3'-di(carboxymethyl)-1,1-biadamantane, 3,3'-di(carboxyethyl)-1,1-biadamantane, 3,3'-di(carboxy-n-propyl)-1,1-biadamantane, 3,3'-di(carboxy-n-butyl)-1,1-biadamantane, 3,3'-di(carboxy-tert-butyl)-1,1-biadamantane, 3,3'-di(carboxy-n-hexyl)-1,1-biadamantane, 3,3'-di(carboxy-n-octyl)-1,1-biadamantane and 2-(2-methyladamantyl)-2'-adamantylmethane hydroxide.

The first compounds may be used alone or in combination of two or more. That is, the resist composition comprises at least one type of the first compound.

The content of the first compound is generally 1 to 50 wt %, preferably 3 to 40 wt %, more preferably 5 to 30 wt % in the resist composition on the basis of the total weight of the resist composition (solid) (hereinafter, referred to as a "solid-converted content").

Next, the base resin contained in the resist composition will be described in detail.

Specific examples of the base resin include polymer compounds such as poly(acrylic acid) polymers, poly(methacrylic acid) polymers, poly(acrylate-acrylic acid) copolymers and poly(methacrylate-methacrylic acid) copolymers.

The base resin is a polymer with good transmittance to a short-wavelength light such as far ultraviolet or vacuum ultraviolet ray, and may be a combination of two or more base resins.

The base resin generally has a weight average molecular weight (Mw) of 2,000 to 100,000, preferably 3,000 to 50,000.

If the molecular weight (Mw) is less than 2,000, it may exhibit poor dry etching resistance, heat resistance or adhesiveness to a substrate to be processed, while if the molecular weight (Mw) is more than 100,000, resist sensitivity may be undesirably reduced.

Furthermore, a dispersion (Mw(weight average molecular weight)/Mn(number average molecular weight)) is generally 5.0 or less, preferably 4.0 or less.

If a dispersion (Mw/Mn) is more than 5.0, solubility of the base resin in a resist solvent is reduced, leading to a cloudy resist film during application of the resist or tendency to deterioration of resist properties such as sensitivity and resolution, while a too small dispersion (Mw/Mn) may lead to a weak resist film or a resist film with poor heat resistance.

The content of the base resin is preferably 50 to 95 wt % as a solid-converted content.

When the resist composition is used as a positive resist, the base resin has a functional group (protective group) which becomes alkali-soluble by the action of an acid (described later) generated from the second compound.

Specifically, when irradiating a resist film consisting of the above resist composition with an active beam (exposure), a photo acid generator forms an acid. By the action of the acid, the above functional group (protective group) is removed to form a polar group such as a carboxylic group. As a result, solubility in the irradiated area (exposed area) is changed and the area becomes soluble to an aqueous alkali solution or polar solvent. Thus, the resist composition acts as a positive resist.

Herein, the functional group (protective group) which becomes alkali-soluble after reaction with an acid may be, for example, —COOR or —OCOR. Examples of R include t-butyl, t-amyl, norbornyl, cyclodecanyl, isopropylethyl, 3-methylpyranyl, tetrahydropyran-2-yl, tetrahydrofuran-2-yl, 4-methoxytetrahydropyran-4-yl, 1-ethoxyethyl, 1-butoxyethyl, 1-propoxyethyl and 3-oxocyclohexyl.

Instead of the above functional group, a bivalent organic group having a bond which is cleaved by a reaction with an acid may be added to the base resin. In this case, the resist composition acts as a positive resist, too.

Examples of the bivalent organic group include carbonyloxy, oxycarbonyloxy, sulfonyl and phenoxy, preferably carbonyloxy and oxycarbonyloxy.

When the resist composition is used as a negative resist, the base resin has a functional group which becomes alkali-insoluble by the action of an acid (described later) generated from the second compound.

The functional group to be alkali-insoluble after reaction with the acid may be, for example, a functional group which may form a crosslink after reaction with an acid, including vinyl, 1-propenyl, allyl, 1-butenyl, 3-butenyl, 1-pentenyl, 2-pentenyl, 4-pentenyl, 1-hexenyl, 2-hexenyl, 3-hexenyl, 4-hexenyl, 5-hexenyl, 2-cyclobutenyl, 2-cyclopentenyl, 1-methyl-2-cyclopentenyl, 2-cyclohexenyl, 3-methyl-2-cyclohexenyl, 1,2-propadienyl, 1,3-butadienyl, 2,3-butadienyl, 1,3-pentadienyl, 2,3-pentadienyl, 2,4-pentadienyl, 2,4-cyclopentadienyl, 1-methyl-2,4-cyclopentadienyl, 3-methyl-2,4-cyclopentadienyl, 3,4-dimethyl-2,4-cyclopentadienyl, 2,5-cyclohexadienyl and 3,5-dimethyl-2,5-cyclohexadienyl.

Next, the second compound contained in the resist composition will be described in detail.

The second compound is a photo acid generator which may be decomposed by irradiation of the active beam (described below) to generate an acid. Examples of the photo acid generator include a photoinitiator in photo cation polymerization, a photoinitiator in photo radical polymerization, a photo decoloring agent for pigments and a photo discoloring agent, and alternatively photo acid generators known in a microphotoresist which may generate an acid by the action of an active beam such as ultraviolet ray, far ultraviolet ray, KrF excimer laser beam, ArF excimer laser beam, electron beam, X-ray, molecular beam and ion beam. In the present invention, it is preferably a photo acid generator which generates an acid by a beam of 250 nm or less.

In the present invention, an active beam is used within a wide concept encompassing radial rays as described above.

Examples of the photo acid generator include triphenylsulfonium salt derivatives as well as onium salts such as sulfonium, iodonium, phosphonium, diazonium and ammonium salts.

Specific examples of the onium salts include diphenyliodonium triflate, diphenyliodonium pyrenesulfonate, diphenyliodonium dodecylbenzenesulfonate, triphenylsulfonium triflate, triphenylsulfonium hexafluoroantimonate, diphenyliodonium hexafluoroantimonate, triphenylsulfonium naphthalenesulfonate, triphenylsulfonium trifluoromethanesulfonate, triphenylsulfonium camphorsulfonate, (4-methoxyphenyl)phenyliodonium trifluoromethanesulfonate and bis(t-butylphenyl)iodonium trifluoromethanesulfonate.

Diazodisulfones, diazoketosulfones, iminosulfonates and disulfones may be also suitably used as the above photo acid generator.

A polymer compound to which a group generating an acid by photoirradiation is introduced in its main or side chain may be also suitably used as the above photo acid generator. Examples of such a polymer include aliphatic alkylsulfonium salts having a 2-oxocyclohexyl group and N-hydroxysuccinimide sulfonates.

These photo acid generators may be used alone or in combination of two or more. They may be combined with an appropriate sensitizer.

The content of a photo acid generator as the second compound is generally 0.001 to 30 wt %, preferably 0.01 to 20 wt %, more preferably 0.2 to 5 wt % as a solid-converted content.

The content of the photo acid generator less than 0.001 wt % may lead to poor sensitivity, the content of the photo acid generator while that more than 40 wt % may lead to excessively higher light absorption by the resist, resulting in deteriorated profile and a smaller process margin, particularly a smaller bake margin.

As described above, the resist composition according to the first embodiment of the present invention comprises the first compound having two or more intramolecular adamantyl structures; the base resin; and the photo acid generator as the second compound generating the acid by irradiation of the active beam such as ArF excimer laser beam.

The resist composition containing the first compound exhibits good dry etching resistance.

A compound having one adamantyl structure in one molecule exhibited inadequate dry etching resistance.

When the base resin comprises a functional group which becomes alkali-soluble by the action of an acid generated from the photo acid generator, the resist composition of the present invention acts as a positive resist, while when the base resin comprises a functional group which becomes alkali-insoluble by the action of the acid, the resist composition of the present invention acts as a negative resist.

A nonion surfactant may be added to the resist composition of the present invention to improve the application or development properties of the resist composition.

Examples of the nonion surfactant include polyoxyethylene lauryl ether, polyoxyethylene stearyl ether, polyoxyethylene octylphenyl ether, polyoxyethylene nonylphenyl ether, polyethyleneglycol dilaurate, polyethyleneglycol distearate, polyoxyethylenesorbitan monostearate and sorbitan monolaurate.

The resist composition of the present invention further comprises a solvent for dissolving the first compound, the base resin and the second compound. The solvent herein may be any organic solvent which adequately dissolves the polymer compound as the base resin and the photo acid generator as the second compound as well as allows the resist solution to be applied by an appropriate method such as spin coating for forming an even applied film.

Examples of the solvent include ethyleneglycol monomethyl ether, ethyleneglycol monomethyl ether acetate, ethyleneglycol monoethyl ether acetate, ethyleneglycol monoisopropyl ether, diethyleneglycol monomethyl ether, diethyleneglycol dimethyl ether, cyclohexanone, cyclopentanone, 2-heptanone, propyleneglycol monomethyl ether, propyleneglycol monomethyl ether acetate, propyleneglycol monomethyl ether propionate, propyleneglycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, 2-ethoxyethyl acetate, isoamyl acetate, methyl lactate, ethyl lactate, toluene, xylene, cyclohexyl acetate, diacetone alcohol, N-methylpyrrolidone, N,N-dimethylformamide, γ-butyrolactone and N,N-dimethylacetamide. These solvents may be used alone or in combination of two or more.

Selection of the above solvent is important because it influences various factors such as solubility of each component in the resist composition, applicability to the substrate to be processed and preservation stability. A moisture content in the above solvent is preferably as low as possible because it influences the above factors.

After dissolving each component in the above solvent, the solution is filtrated through a filter with a pore size of about 0.05 μm to 0.2 μm to provide a resist solution (described later).

An amine may be added to the resist composition of the present invention to improve resist properties such as a resolution, a pattern shape and a mask linearity even when a short-wavelength active beam such as ArF excimer laser is used as an exposure light source.

Examples of the amine include aliphatic primary amines such as nonylamine, decylamine, tridecylamine, tetradecylamine and pentadecylamine; aliphatic secondary amines such as diamylamine; aliphatic tertiary amines such as tributylamine and triamylamine; aromatic amines such as di(4-methylbenzyl)amine, diphenylamine and tribenzylamine; and alicyclic amines such as hexamethylenetetramine. Among these, aromatic amines such as diphenylamine and alicyclic amines such as hexamethylenetetramine are suitable.

The amine is preferably a high-boiling compound with a boiling point of 200 to 350° C., preferably 210 to 330° C. at 101.3 KPa because the process comprises the step of baking the substrate at high temperature after forming a resist film on the substrate to be processed.

A molecular weight of the amine is generally 100 to 240, preferably 120 to 220, more preferably 140 to 200.

An excessively higher molecular weight generally tends to increase a melting point so that an amine may be precipitated during storage or development with an alkali developing solution, whereas an excessively smaller molecular weight may reduce a boiling point.

An excessively higher boiling point is generally associated with a higher molecular weight and a bulky shape, leading to inadequate diffusion in the resist film and therefore a poor shape due to influence of an insoluble layer on the resist film surface, while an amine with an excessively lower boiling point may be evaporated at a baking temperature during formation of a resist pattern and therefore inadequately effective.

The resist composition may, if necessary, contain other components such as a dissolution inhibitor, a surfactant, a pigment, a stabilizer, an applicability improver and a dye.

In the resist composition of the present invention, it is preferable to reduce a content of metal impurities including a metal or impurities such as chloride ion to 100 ppb or less. An excessive amount of these impurities may undesirably cause malfunction, defects or a reduced yield in manufacturing a semiconductor device.

Second Embodiment

There will be described a method for manufacturing a semiconductor device according to a second embodiment of the present invention. This manufacturing process is a method for manufacturing a semiconductor device using the resist composition according to the first embodiment.

First, there will be described a method for manufacturing a semiconductor device using a resist composition comprising the first compound, the base resin and the second compound (hereinafter, referred to as the "first resist composition"; see the first embodiment).

The first resist composition is first applied onto a substrate to be processed by an appropriate technique such as rotary application to form a resist film.

Here, the substrate to be processed may be a substrate generally used in manufacturing a semiconductor device; for example, a silicon substrate, a compound semiconductor substrate, a glass substrate such as a silicate glass substrate (Qz) and a non-magnetic ceramic substrate. On the substrate to be processed, there may be formed desired layers such as silicon oxide layer, an interconnect metal layer, an interlayer insulating film, a magnetic film and an anti-reflection film as well as a variety of interconnection or circuits.

The thickness of the resist film formed on the substrate is preferably about 0.01 to 10 $\mu$m. When ArF excimer laser is used as an exposure light source, a suitable resist film thickness is about 0.1 to 1.5 $\mu$m.

Next, the resist film formed on the substrate is prebaked by heating it at a temperature of about 60 to 160° C. within which the resist film may not be deteriorated, for about 30 to 300 sec (pre-exposure baking, or pre-exposure heating).

A lower prebaking temperature and a shorter time may increase residual solvent in the resist film, leading to poor adhesiveness of the resist film, while a higher prebaking temperature and a longer time may cause thermal decomposition of the base resin and the second compound as the constituents in the first resist composition, leading to thermo setting of the resist film.

Then, the resist film is irradiated with an active beam (exposure light) with a wavelength of 150 to 250 nm through a given mask.

An exposure system used in an exposure step may be, for example, an ultraviolet exposure system, an X-ray exposure system, an electron-beam exposure system, a KrF excimer laser exposure system, an ArF laser excimer exposure system and an F$_2$ excimer laser exposure system. In a manufacturing process according to the second embodiment, the above ArF excimer exposure system using ArF excimer laser as an exposure light source is suitable.

Next, as described for prebaking, the resist film after exposure is postbaked by heating it at a temperature of about 60 to 160° C., preferably about 90 to 150° C. (post-exposure baking (PEB), or post-exposure heating).

This postbaking causes removal of a functional group (protective group) by an acid catalyst while eliminating a residual stationary wave in the resist film and diffusing agents such as a photo acid generator in the resist film.

Next, the resist film may be developed to provide a resist pattern with good dry etching resistance.

A developing solution may be an aqueous alkaline solution including inorganic alkalis such as sodium hydroxide, potassium hydroxide, sodium carbonate, sodium silicate and ammonium hydroxide; primary amines such as ethylamine and n-propylamine; secondary amines such as diethylamine and di-n-butylamine; tertiary amines such as triethylamine and methyldiethylamine; alcoholamines such as dimethylethanolamine and triethanolamine; quaternary ammonium salts such as tetramethylammonium hydroxide (TMAH), tetraethylammonium hydroxide (TEAH), trimethylhydroxymethylammonium hydroxide, triethylhydroxymethylammonium hydroxide and trimethylhydroxyethylammonium hydroxide; and cyclic amines such as pyrrole, piperidine, 1,8-diazabicyclo-[5.4.0]-7-undecene and 1,5-diazabicyclo-[4.3.0]-5-nonane.

The aqueous alkaline solution may further contain an appropriate amount of a hydrophilic organic solvent such as alcohols and ketones, a nonion, anion or cation surfactant, or an antifoaming agent. These additives may improve adhesiveness to a substrate to be processed, reduce the amount of the developing solution or reduce defects due to foams during development.

Next, there will be a method for manufacturing a semiconductor device using a resist composition obtained by adding an amine (see the first embodiment) to the first resist composition (hereinafter, referred to as the "second resist composition").

Since a method for manufacturing a semiconductor device using the second resist composition is substantially similar to that using the first resist composition, there will be briefly described the process, focusing on differences between them.

A resist film with a thickness of about 0.01 $\mu$m to 2 $\mu$m is first formed on a substrate to be processed by means of applying the second resist composition onto the substrate.

Next, the resist is prebaked at a temperature of 80 to 190° C., preferably 100 to 170° C. within which the resist may not be thermally deteriorated, before exposure.

Further, the resist film is irradiated with (exposed to) radial rays (active beam) such as ultraviolet ray, far ultraviolet ray from KrF or ArF excimer laser, vacuum ultraviolet ray, electron beam, X-ray and laser beam, preferably exposure light from a light source of ArF excimer laser, through a mask.

Next, the resist after exposure is postbaked at about 70 to 180° C., and then developed using the above developing solution to provide a resist pattern with good dry etching resistance.

As described above, a method for manufacturing a semiconductor device according to the second embodiment comprises the steps of: applying the first resist composition according to the first embodiment onto the substrate to be processed to form a resist film with a given film thickness; prebaking the resist film formed on the substrate; irradiating the resist film with the active beam from the light source of ArF excimer laser through the given mask after prebaking; postbaking the resist film; and developing the resist film after postbaking. Thus, the resist pattern with good dry etching resistance is formed on the substrate.

Also, a resist pattern, which is formed by the method for manufacturing a semiconductor device using the second resist composition further comprising an amine, exhibited excellent resolution, pattern shape and mask linearity.

Adhesiveness of the resist film may be improved by water-repelling treatment of the substrate to be processed before forming the resist film. A suitable water-repellent used may be, for example, 1,1,1,3,3,3-hexamethyldisilazane (HMDS).

Third Embodiment

In the third embodiment, there will be described a method for preparing 3,3'-dicarbopropoxy-1,1'-biadamantane as an example of the first compound contained in the above resist composition (see the first embodiment).

In conc. sulfuric acid (5 ml) was dissolved 3,3'-dihydroxy-1,1'-biadamantane (0.5 g/1.65 mmol) and then slowly added formic acid (1 ml) dropwise at 20° C.

Next, after stirring for 2 hours, the reaction solution was poured onto ice and the precipitate was collected by filtration.

Further, the precipitate was dissolved in an aqueous solution of sodium hydroxide and the solution was then filtrated to remove insolubles.

Next, the filtrate was again made strongly acidic by adding hydrochloric acid to precipitate carboxylic acid, which was then collected by filtration and washed with water until a washing became neutral.

Then, the precipitate was washed with methanol and dried under vacuum.

Next, thionyl chloride (10 ml) was added to 3,3'-dicarboxy-1,1'-biadamantane thus obtained, and the mixture was refluxed for 3 hours to provide a homogeneous solution and excessive thionyl chloride was evaporated under a reduced pressure.

Next, to the residue was added dry n-propanol (10 ml), and the mixture was refluxed for one hour. Further, to the reaction was added methanol, the mixture was filtrated and the filtrate was concentrated.

Then, hexane was added to the residue, insolubles were removed by filtration and the filtrate was concentrated.

Finally, acetone was added to the residue, insolubles were removed by filtration and the filtrate was concentrated to provide 3,3'-dicarbopropoxy-1,1'-biadamantane.

A yield of 3,3'-dicarbopropoxy-1,1'-biadamantane as the first compound prepared by the preparing process according to the third embodiment was 0.6 g and its purity was 99.7% by gas chromatography. The product, 3,3'-dicarbopropoxy-1,1'-biadamantane, was identified by gas chromatography and NMR spectra.

Fourth Embodiment

In the fourth embodiment, there will be described a process for preparing 2-(2-methyladamantyl)-2'-adamantylmethane hydroxide as an example of the first compound contained in the resist composition (see the first embodiment).

In a 200 ml four-necked flask equipped with a mechanical stirrer, a reflux condenser and a Dean-Stark trap were placed 41.5 g (250 mmol) of 2-methyl-2-adamantanol, 5 g of sulfuric acid and 120 ml of n-heptane. The mixture was heated in an oil bath and reacted under reflux of the solvent for 4 hours while removing water.

After completion of the reaction, the reaction solution was poured into 100 g of water and the mixture was neutralized with an aqueous solution of sodium carbonate. Further, the product was extracted with n-heptane and the oil phase was washed with water.

Then, n-heptane was removed with a rotary evaporator to give a crude product, which was then purified by silica gel column chromatography and recrystallized.

Next, in a 300 ml autoclave were placed 15 g of the recrystallized compound, 150 ml of n-octanol and 3 g of 5% Pd/C. The mixture was reacted under 3 MPa of hydrogen at 200° C. for 5 hours.

Further, 6 g of the compound obtained by the reaction was placed in a four-necked flask. To the stirred mixture by a stirrer was added 25 g of bromine dropwise from a dropping funnel, and the mixture was reacted at 60° C. for 4 hours.

After completion of the reaction, the reaction solution was allowed to be cooled and poured into a flask containing 100 g of ice and 50 ml of carbon tetrachloride. Excessive bromine was treated with sodium hydrogen sulfite.

Next, after the mixture was treated with carbon tetrachloride, washed with water, the solvent was evaporated to give 12.2 g of the product compound.

Next, in a 100 ml autoclave were placed the compound, 50 ml of pyridine and 18 ml of water. Then, the mixture was reacted at 150° C. for 6 hours.

After completion of the reaction, the mixture was treated with sodium carbonate to decompose pyridinium salt formed by the reaction.

The solid decomposed by the above treatment was filtrated, the solvent was evaporated and water was added to provide a product.

Finally, the product was purified by silica gel column chromatography to give 2-(2-methyladamantyl)-2'-adamantylmethane hydroxide.

The product thus obtained, 2-(2-methyladamantyl)-2'-adamantylmethane hydroxide, was identified by gas chromatography and NMR spectra.

Fifth Embodiment

There will be described a method for manufacturing a semiconductor device according to the fifth embodiment.

In a solvent (see the first embodiment) were dissolved a resist composition comprising 20 wt parts of 3,3'-dibromo-1,1'-biadamantane as the first compound, 100 wt parts of polyisobornylmethacrylate-methacrylic acid copolymer as the base resin and 2 wt parts of triphenylsulfonium trifluoromethanesulfonate as the second compound to prepare a resist solution (a solid content of 4 wt %).

Then, the resist solution was spin-coated on a silicon substrate which had been pre-treated with hexamethylenedisilazane at 90° C. for 180 sec. Further, the substrate is prebaked at 115° C. for 60 sec to form a resist film with a thickness of 0.5 $\mu$m.

Here, dependency of a transmittance of the resist film on a wavelength was determined using an ultraviolet-visible spectrometer, giving the result that a transmittance was 60% at 193 nm which was a central wavelength of ArF excimer laser. It was confirmed that a resist film formed using the resist composition exhibited adequate transparency as a single-layer resist.

Next, to the resist film was exposed a pattern with a line-and-space of 0.15 $\mu$m using an ArF excimer laser exposure system (NA=0.6, $\sigma$=0.75) at an exposure of 15 mJ/cm$^2$.

After exposure, the resist film was postbaked at 115° C. for 60 sec.

Then, the film was developed with a 2.38% aqueous solution of tetramethylammonium hydroxide for 60 sec. and rinsed with pure water to give a resist pattern.

It was confirmed by observation of the resist pattern with a scanning electron microscope that the resist pattern had a rectangular cross section. Accordingly, it could be confirmed that the resist composition according to the present invention provided a quite excellent resolution.

Next, the substrate on which the resist pattern was formed was placed in a parallel plate type of etching system and subject to dry etching under the conditions of a $C_2F_6$ flow rate: 50 sccm, an $O_2$ flow rate: 15 sccm, a pressure: 5 mTorr, an upper-electrode power: 200 W, a lower-electrode power: 5 W and a substrate temperature: −10° C.

A film reduction of the resist pattern by the dry etching was determined.

As a result, the film reduction of the resist pattern by etching was reduced by 27% or more in comparison with a resist pattern formed using a conventional resist composition without 3,3'-dibromo-1,1'-biadamantane.

In the method for manufacturing a semiconductor device according to the fifth embodiment, the resist film was formed using the resist composition comprising 3,3'-dibromo-1,1'-biadamantane as the first compound, and the resist film was exposed to ArF excimer laser beam to form the resist pattern. Further, using the resist pattern as a mask, dry etching was conducted and the film reduction in the resist pattern by etching was determined.

According to the manufacturing process, the resist film obtained from the resist composition had excellent transmittance to ArF excimer laser and exhibited adequate transparency as a single layer resist.

Also, a film reduction of the resist pattern by etching may be reduced by 27% or more in comparison with a conventional resist pattern formed using a resist composition without 3,3'-dibromo-1,1'-biadamantane as the first compound.

Accordingly, the process may provide a resist film exhibiting an excellent transmittance to ArF excimer laser beam and provide a resist pattern with quite excellent dry etching resistance. It may allow stable dry etching to be conducted with minimized reduction of a resist film and of a line-width variation, resulting in improved device performance of a semiconductor device.

Here, 3,3'-dibromo-1,1'-biadamantane (20 wt parts) as the first compound contained in the resist composition may be replaced with 3,3'-dicarboxymethyl-1,1'-biadamantane (20 wt parts). In this case, a film reduction of the resist pattern by etching could be reduced by 10% or more in comparison with a resist pattern formed using a conventional resist composition without 3,3'-dicarboxymethyl-1,1'-biadamantane (or 3,3'-dibromo-1,1'-biadamantane) as the first compound. It was found that the resist pattern had a rectangular cross section, indicating that the resist composition according to the present invention provided a quite excellent resolution.

In place of the parallel plate type of etching system, a reactive ion etching system using a $CF_4$—$O_2$ gas system may be used. In this case, a film reduction of the resist pattern by etching can be reduced by 15% or more in comparison with a resist pattern formed using a conventional resist composition without 3,3'-dibromo-1,1'-biadamantane.

In place of the parallel plate type of etching system, an ECR plasma etching system using a $CF_4$—$CHF_3$—Ar gas system may be used. In this case, a film reduction of the resist pattern by etching can be reduced by 10% or more in comparison with a resist pattern formed using a conventional resist composition without 3,3'-dibromo-1,1'-biadamantane.

The exposure system may be KrF excimer laser exposure system in place of ArF excimer laser exposure system.

Furthermore, an exposure pattern may be a 0.18 μm line-and-space pattern in place of a 0.15 μm line-and-space pattern. Under these conditions, the resist pattern had a rectangular cross section, giving a good resolution. A film reduction by etching may be reduced by 27% or more than that for a conventional resist material without 3,3'-dibromo-1,1'-biadamantane.

Sixth Embodiment

There will be described a method for manufacturing a semiconductor device according to the sixth embodiment.

In the method for manufacturing a semiconductor device according to the sixth embodiment, the amount of 3,3'-dibromo-1,1'-biadamantane (the first compound) in the resist composition used in the fifth embodiment were varied from 0, 10, 20 to 30 wt parts, and for each composition a resist pattern was formed and dry etching was conducted as described in the fifth embodiment.

For each resist composition, a film reduction of the resist pattern by dry etching, i.e., an etching rate of the resist film was determined.

The results are shown in FIG. 1. That is, FIG. 1 shows each etching rate of a resist film when varying a composition ratio of 3,3'-dibromo-1,1'-biadamantane (acting as the first compound) in the resist composition.

As shown in FIG. 1, increase of the composition ratio of 3,3'-dibromo-1,1'-biadamantane (the first compound) in the resist composition may reduce an etching rate for a resist film formed using the above resist composition.

As described above, in the sixth embodiment, the composition ratio of 3,3'-dibromo-1,1'-biadamantane as the first compound contained in the resist composition was varied and for each resist film an etching rate was determined.

Thus, increase of the composition ratio of 3,3'-dibromo-1,1'-biadamantane as the first compound may reduce an etching rate of the resist film, i.e., a film reduction in the resist film. It may, therefore, allow more stable dry etching to be conducted with a minimized resist reduction and a less variation in a line width.

The amount of 3,3'-dibromo-1,1'-biadamantane may be controlled for controlling an etching rate for a resist film. The composition ratio of the first compound in a resist composition may be, therefore, varied to form a resist pattern suitable to dry etching conditions.

Seventh Embodiment

There will be described a method for manufacturing a semiconductor device according to the seventh embodiment.

In a solvent (see the first embodiment) were dissolved a resist composition comprising 20 wt parts of 2-(2-methyladamantyl)-2'-adamantylmethane hydroxide as the first compound, 100 wt parts of polyisobornylmethacrylate-methacrylic acid copolymer as the base resin and 2 wt parts of triphenylsulfonium trifluoromethanesulfonate as the second compound to prepare a resist solution (a solid content of 4 wt %).

Then, the resist solution was spin-coated on a silicon substrate which had been pre-treated with hexamethylene-disilazane at 90° C. for 180 sec. Further, the silicon substrate is prebaked at 115° C. for 60 sec to form a resist film with a thickness of 0.5 μm.

Next, to the resist film was exposed a pattern with a line-and-space of 0.14 μm using an ArF excimer laser exposure system (NA=0.6, σ=0.75) at an exposure of 15 mJ/cm².

After exposure, the resist film was postbaked at 115° C. for 60 sec.

Then, the film was developed with a 2.38% aqueous solution of tetramethylammonium hydroxide for 60 sec. and rinsed with pure water to give a resist pattern.

It was confirmed by observation of the resist pattern with a scanning electron microscope that the resist pattern had a rectangular cross section. Accordingly, it could be confirmed that the resist composition according to the present invention provided a quite excellent resolution.

Next, the substrate on which the resist pattern was formed was placed in a parallel plate type of etching system and subject to dry etching under the conditions of a $C_2F_6$ flow rate: 50 sccm, an $O_2$ flow rate: 15 sccm, a pressure: 5 mTorr, an upper-electrode power: 200 W, a lower-electrode power: 5 W and a substrate temperature: −10° C.

A film reduction of the resist pattern by the dry etching was determined.

As a result, a film reduction of the resist pattern by etching was reduced by 27% or more in comparison with a resist pattern formed using a conventional resist composition without 2-(2-methyladamantyl)-2'-adamantylmethane hydroxide.

Here, 2-(2-methyladamantyl)-2'-adamantylmethane hydroxide (20 wt parts) as the first compound contained in the resist composition was replaced with 3,3'-dicarboxy(1-propyl)-1,1'-biadamantane (20 wt parts). As described in the above manufacturing process, a resist pattern was formed and dry etching was conducted using the resist pattern as a mask. A film reduction of the resist film by dry etching was determined.

As a result, a film reduction of the resist pattern by etching was reduced by 10% or more in comparison with a resist pattern formed using a conventional resist composition without 3,3'-dicarboxy(1-propyl)-1,1'-biadamantane or 2-(2-methyladamantyl)-2'-adamantylmethane hydroxide as the first compound.

It was confirmed by observation of the resist pattern before etching with scanning electron microscopy that the resist pattern had a rectangular cross section. Accordingly, it could be confirmed that the resist composition of the present invention provided quite excellent resolution.

As described above, in the manufacturing process of a semiconductor device according to the seventh embodiment, a resist composition comprising 2-(2-methyladamantyl)-2'-adamantylmethane hydroxide as the first compound was used for forming a resist pattern, which was then used as a mask for dry etching.

According to the above manufacturing process, a film reduction of the resist pattern by etching can be reduced by 10% or more in comparison with a conventional resist pattern formed using a resist composition without 2-(2-methyladamantyl)-2'-adamantylmethane hydroxide as the first compound.

When using 3,3'-dicarboxy(1-propyl)-1,1'-biadamantane as the first compound contained in a resist composition, a film reduction by etching can be reduced by 10% or more.

Accordingly, this process may provide a resist pattern with quite excellent dry etching resistance, allowing stable dry etching to be conducted with a less film reduction and a less line-width variation.

This invention, when practiced illustratively in the manner described above, provides the following major effects:

According to the present invention, since a resist composition comprises at least one type of the first compound having two or more intramolecular adamantyl structures, it can provide a resist composition with excellent dry etching resistance and a resist composition with good transmittance to ArF excimer laser beam as an active beam.

The resist composition may further comprise a nonion surfactant for improving its application and development properties.

The resist composition may further comprise an amine for improving resolution, a resist pattern shape and mask linearity.

A resist film formed using a resist composition comprising at least one type of the first compound having two or more intramolecular adamantyl structures exhibits good transmittance to ArF excimer laser beam.

A resist pattern formed using a resist composition comprising at least one type of the first compound having two or more intramolecular adamantyl structures exhibits good dry etching resistance.

Thus, it may reduce a film-thickness reduction and a line-width variation of the resist pattern by dry etching, leading to stable dry etching.

Further, the present invention is not limited to these embodiments, but variations and modifications may be made without departing from the scope of the present invention.

The entire disclosure of Japanese Patent Application No. 2000-244161 filed on Aug. 11, 2000 containing specification, claims, drawings and summary are incorporated herein by reference in its entirety.

What is claimed is:

1. The resist composition comprising:
   at least one type of a first compound having two or more intramolecular adamantyl structures;
   a base resin; and
   a second compound which generates an acid by active beam irradiation; wherein
   at least one type of said first compound is represented by the chemical formula 1:

[Chemical formula 1]

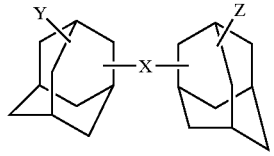

wherein X is —(OCO)$_m$—(CH$_2$)$_n$—(COO)$_m$—, where m=0 or 1 and n=0, 1, 2 or 3 provided when n=0, m=0; and Y and Z are H, OH, F, Cl, Br, R or COOR, where Y may be Z, or Y and Z may be introduced in a single adamantyl structure and R represents a straight or branched alkyl group having 1 to 8 carbon atoms, wherein if Y is H then Z is one of OH, F, Cl, Br, R or COOR, and if Z is H, then Y is one of OH, F, Cl, BR, R or COOR, and wherein if Y is R then Z is one of H, OH, F, Cl, Br or COOR, and if Z is R then Y is one of H, OH, F, Cl, Br or COOR.

2. The resist composition according to claim 1, wherein said first compound is selected from the group consisting of 3,3'-dibromo-1,1'-biadamantane, di(1-adamantyl)succinic acid, di(1-adamantyl)malonic acid, 3,3'-di(carboxymethyl)-1,1-biadamantane, 3,3'-di(carboxyethyl)-1,1-biadamantane, 3,3'-di(carboxy-n-propyl)-1,1-biadamantane, 3,3'-di(carboxy-n-butyl)-1,1-biadamantane, 3,3'-di(carboxy-tert-butyl)-1,1-biadamantane, 3,3'-di(carboxy-n-hexyl)-1,1-biadamantane, 3,3'-di(carboxy-n-octyl)-1,1-biadamantane and 2-(2-methyladamantyl)-2'-adamantylmethane hydroxide.

3. The resist composition according to claim 1, wherein a content of said first compound is 1 to 50 wt %.

4. The resist composition according to claim 1, wherein said base resin is at least one of the group consisting of poly(acrylic acid) polymers, poly(methacrylic acid) polymers, poly(acrylate-acrylic acid) copolymers and poly (methacrylate-methacrylic acid) copolymers.

5. The resist composition according to claim 4, wherein said base resin contains a functional group which becomes alkali-soluble by the action of the acid generated from said second compound.

6. The resist composition according to claim 4, wherein said base resin contains a functional group which becomes alkali-insoluble by the action of the acid generated from said second compound.

7. The resist composition according to claim 4, wherein said base resin has a weight-average molecular weight of 2,000 to 100,000.

8. The resist composition according to claim 4, wherein a content of said base resin is 50 to 95 wt %.

9. The resist composition according to claim 1, wherein said second compound is at least one of the group consisting of triphenylsulfonium salt derivatives, onium salts, diazodisulfones, diazoketosulfones, iminosulfonates, disulfones, polymer compounds to which a group generating an acid by photoirradiation is introduced in its main or side chain, aliphatic alkylsulfonium salts having a 2-oxocyclohexyl group and N-hydroxysuccinimide sulfonates.

10. The resist composition according to claim 9, wherein the content of said second compound is 0.001 to 30 wt %.

11. The resist composition according to claim 1, further comprising a solvent dissolving said first compound, said second compound and said base resin.

12. The resist composition according to claim 11, wherein said solvent is at least one of the group consisting of ethyleneglycol monomethyl ether, ethyleneglycol monomethyl ether acetate, ethyleneglycol monoethyl ether acetate, ethyleneglycol monoisopropyl ether, diethyleneglycol monomethyl ether, diethyleneglycol dimethyl ether, cyclohexanone, cyclopentanone, 2-heptanone, propyleneglycol monomethyl ether, propyleneglycol monomethyl ether acetate, propyleneglycol monomethyl ether propionate, propyleneglycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, 2-ethoxyethyl acetate, isoamyl acetate, methyl lactate, ethyl lactate, toluene, xylene, cyclohexyl acetate, diacetone alcohol, N-methylpyrrolidone, N,N-dimethylformamide, γ-butyrolactone and N,N-dimethylacetamide.

13. The resist composition according to claim 1, further comprising a nonionic surfactant.

14. The resist composition according to claim 13, wherein said nonion surfactant is selected from the group consisting of polyoxyethylene lauryl ether, polyoxyethylene stearyl ether, polyoxyethylene octylphenyl ether, polyoxyethylene nonylphenyl ether, polyethyleneglycol dilaurate, polyethyleneglycol distearate, polyoxyethylenesorbitan monostearate and sorbitan monolaurate.

15. The resist composition according to claim 1, further comprising an amine.

16. The resist composition according to claim 15, wherein said amine is selected from the group consisting of nonylamine, decylamine, tridecylamine, tetradecylamine, pentadecylamine, diamylamine, tributylamine, triamylamine, di(4-methylbenzyl)amine, diphenylamine, tribenzylamine and hexamethylenetetramine.

17. The resist composition according to claim 15, wherein said amine has a boiling point of 200 to 350° C. at 101.3 KPa.

18. A method for manufacturing a semiconductor device comprising:

an application step of forming a resist film by means of applying the resist composition according to claim 1, onto a substrate;

a pre-exposure heating step of heating the resist film formed in said application step;

an exposure step of exposing the resist film by means of irradiating the resist film with an active beam via a given mask after said pre-exposure heating step, the active beam having a wavelength of 150 to 250 nm;

a post-exposure heating step of heating the resist film after said exposure step;

a development step of forming a resist pattern by means of developing the resist; and an etching step of conducting dry etching with the resist pattern as a mask.

19. The method for manufacturing a semiconductor device according to claim 18, wherein in said exposure step, the resist film is exposed with ArF excimer laser beam as the active beam.

20. A resist composition comprising:

at least one type of a first compound having two or more intramolecular adamantly structures;

a base resin; and a second compound which generates an acid by active beam irradiation; wherein least one type of said first compound is represented by the chemical formula 1:

[Chemical formula 1]

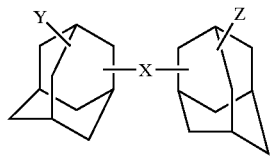

wherein X is —(CH$_2$)$_n$—, where n=0, 1, 2 or 3; and Y and Z are H, OH, F, Cl, Br, R or COOR, where Y may be Z or Y and Z may be introduced in a single adamantly structure and where R represents a straight or branched alkyl group having 1 to 8 carbon atoms, wherein if Y is H then Z is one of OH, F, Cl, Br, R or COOR, and if Z is H they Y is one of OH, F, Cl, Br, R or COOR, and wherein if Y is R then Z is one of H, OH, F, Cl, Br or COOR, and if Z is R then Y is one of H, OH, F, Cl, Br or COOR.

21. A resist composition comprising:

at least one type of a first compound having two or more intramolecular adamantly structures;

a base resin; and a second compound which generates an acid by active beam irradiation; wherein least one type of said first compound is represented by the chemical formula 1:

[Chemical formula 1]

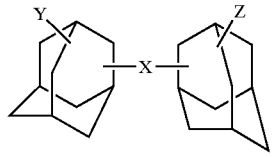

wherein X is —(OCO)m-(CH$_2$)$_n$—(COO)m-, where m=0 or 1 and n=0, 1, 2 or 3 provided when n=0, m=0; and Y and Z are OH, F, Cl Br or COOR, where Y may be Z, or Y and Z may be introduced in a single adamantly structure and where R represents a straight or branched alkyl group having 1 to 8 carbon atoms.

* * * * *